US010038149B2

(12) United States Patent
Qiu et al.

(10) Patent No.: US 10,038,149 B2
(45) Date of Patent: Jul. 31, 2018

(54) ORGANIC ELECTROLUMINESCENT AND PREPARATION METHOD THEREOF

(71) Applicants: BEIJING VISIONOX TECHNOLOGY CO., LTD., Beijing (CN); TSINGHUA UNIVERSITY, Beijing (CN)

(72) Inventors: Yong Qiu, Beijing (CN); Lian Duan, Beijing (CN); Mengzhen Li, Beijing (CN); Guohui Zhang, Beijing (CN); Song Liu, Beijing (CN)

(73) Assignees: BEIJING VISIONOX TECHNOLOGY CO., LTD., Beijing (CN); TSINGHUA UNIVERSITY, Beijing (CN)

( * ) Notice: Subject to any disclaimer, the term of this patent is extended or adjusted under 35 U.S.C. 154(b) by 43 days.

(21) Appl. No.: 15/109,406

(22) PCT Filed: Dec. 29, 2014

(86) PCT No.: PCT/CN2014/095334
§ 371 (c)(1),
(2) Date: Jun. 30, 2016

(87) PCT Pub. No.: WO2015/101257
PCT Pub. Date: Jul. 9, 2015

(65) Prior Publication Data
US 2016/0380213 A1 Dec. 29, 2016

(30) Foreign Application Priority Data
Dec. 31, 2013 (CN) .......................... 2013 1 0747676

(51) Int. Cl.
*H01L 51/00* (2006.01)
*H01L 51/50* (2006.01)
*H01L 51/52* (2006.01)
*H01L 51/56* (2006.01)

(52) U.S. Cl.
CPC ........ *H01L 51/0081* (2013.01); *H01L 51/006* (2013.01); *H01L 51/0077* (2013.01); *H01L 51/0082* (2013.01); *H01L 51/5076* (2013.01); H01L 51/001 (2013.01); H01L 51/008 (2013.01); H01L 51/0023 (2013.01); H01L 51/0058 (2013.01); H01L 51/0079 (2013.01); H01L 51/5012 (2013.01); H01L 51/5056 (2013.01); H01L 51/5206 (2013.01); H01L 51/5221 (2013.01); H01L 51/56 (2013.01)

(58) Field of Classification Search
CPC .................................................. H01L 51/0081
See application file for complete search history.

(56) References Cited

U.S. PATENT DOCUMENTS

| 6,284,393 | B1 * | 9/2001 | Hosokawa | ............ H05B 33/28 257/91 |
|---|---|---|---|---|
| 2006/0232192 | A1 | 10/2006 | Qiu et al. | |
| 2009/0004573 | A1 | 2/2009 | Qiu Yong | |
| 2009/0162644 | A1 | 6/2009 | Ricks et al. | |
| 2011/0121268 | A1 | 5/2011 | Naga et al. | |
| 2013/0139510 | A1 | 6/2013 | Kottilingam | |
| 2013/0207082 | A1 * | 8/2013 | Cho | .................... H01L 51/5016 257/40 |
| 2014/0203246 | A1 * | 7/2014 | Liu | ..................... H01L 51/5076 257/40 |

FOREIGN PATENT DOCUMENTS

| CN | 102916134 | A |   | 2/2013 |
| CN | 101891673 | B |   | 3/2013 |
| CN | 103078061 |   | * | 5/2013 |
| CN | 103078061 | A |   | 5/2013 |
| CN | 103247761 |   | * | 8/2013 |
| CN | 103247761 | A |   | 8/2013 |
| CN | 101875637 | B |   | 11/2013 |
| CN | 103700775 | A |   | 4/2014 |
| EP | 1011155 | A2 |   | 6/2000 |
| EP | 2629346 | A2 |   | 8/2013 |
| JP | 2006-352072 | A |   | 12/2006 |
| JP | 2011-508421 | A |   | 3/2011 |
| JP | 2012-184763 | A |   | 9/2012 |
| JP | 2013-127858 | A |   | 6/2013 |
| JP | 2013-179320 | A |   | 9/2013 |
| TW | 201122080 | A1 |   | 7/2011 |
| WO | 2007/050331 | A1 |   | 3/2007 |
| WO | 2007/123061 | A1 |   | 11/2007 |

* cited by examiner

*Primary Examiner* — Doris L Lee
(74) *Attorney, Agent, or Firm* — Maschoff Brennan

(57) ABSTRACT

Disclosed are an organic electroluminescent device and a preparation method thereof. The organic electroluminescent device comprises an anode, a hole transport layer, an organic light-emitting layer, an electron transport layer and a cathode. An organic metal complex and an active metal compound are doped in the electron transport layer, wherein the active metal compound is an alkali metal complex, an alkali earth metal complex or a lanthanide metal compound. The preparation method thereof includes the following steps: etching an anode pattern, and evaporating a hole transport layer and an organic light-emitting layer on an ITO glass substrate in order; and co-evaporate an electron transport material, an organic metal complex and an active metal compound to form an electron transport layer; and evaporating a cathode on the electron transport layer.

12 Claims, 1 Drawing Sheet

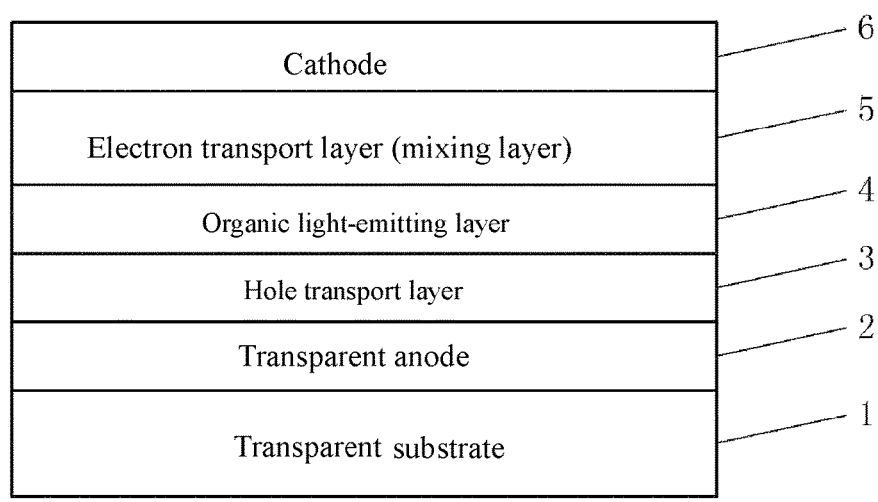

ORGANIC ELECTROLUMINESCENT AND PREPARATION METHOD THEREOF

TECHNICAL FIELD

The present invention relates to the technical field of organic electroluminescence and in particular to an organic electroluminescent device and a preparation method thereof.

BACKGROUND

Organic light-emitting diode (OLED) devices are active light-emitting devices. Compared with the thin film transistor LCDs (TFT-LCDs) in the existing mainstream flat panel display technology, OLEDs, due to their advantages such as high contrast, wide angle of view, low power consumption, smaller size and the like, are expected to become the next-generation flat panel display technology following LCDs, and are one of the technologies that are highly concerned among the existing flat panel display technologies.

An OLED device generally comprises an anode, an hole transport layer (HTL), an emission layer (EL), an electron transport layer (ETL), and a cathode. In the prior art, the electron transport layer is typically made of a single organic material. However, an OLED device prepared by using the electron transport layer made from the single organic material typically has a relatively high driving voltage and a relatively low efficiency, leading to problems of high power consumption of an OLED screen, short service life and the like. In an organic electroluminescent device, in order to lower the operating voltage of the device and improve the charge balance between electrons and holes, it is necessary to improve the electron injection and transport efficiency. In the existing technologies for improving the electron injection efficiency, it is necessary to define the material of a cathode following the electron transport layer, and this cathode material is required to have one metal which may reduce metal ions in an organic complex to a corresponding metal in vacuum. This restricts the selection of the cathode material.

SUMMARY

Technical Problem

The present invention is intended to provide an organic electroluminescent device with high electron injection efficiency, and a preparation method thereof.

Solution to the Technical Problem

To solve the aforementioned technical problem, the present invention provides an organic electroluminescent device comprising an anode, a hole transport layer, an organic light-emitting layer, an electron transport layer and a cathode. An organic metal complex and an active metal compound are doped in the electron transport layer, wherein the active metal compound is an alkali metal compound, an alkaline earth metal compound, or a lanthanide metal compound.

Further, the organic metal complex is a quinoline metal complex.

Further, the quinoline metal complex is $Alq_3$ or $Gaq_3$.

Further, the alkali metal compound is an alkali metal nitride or an alkali metal borohydride; the alkali earth metal compound is an alkaline earth metal nitride or an alkali earth metal borohydride; and the lanthanide metal compound is a lanthanide metal nitride or a lanthanide metal borohydride.

Further, the alkali metal nitride includes $Li_3N$, $Na_3N$, $K_3N$ or $Rb_3N$; the alkali earth metal nitride includes $Mg_3N_2$, $Ca_3N_2$, $Sr_3N_2$ or $Ba_3N_2$; the lanthanide metal nitride includes LaN; and the alkali metal borohydride includes $LiBH_4$, $NaBH_4$ or $KBH_4$.

Further, the molar ratio of electron transport material, the organic metal complex and the active metal compound in the electron transport layer is 1:(0.01-5):(0.01-5).

Further, the molar ratio of the electron transport material, the organic metal complex and the active metal compound in the electron transport layer is 1:1:1.

The present invention further provides a method for preparing an organic electroluminescent device, including:

etching an anode pattern, evaporating an hole transport layer and an organic light-emitting layer in order on an ITO glass substrate; and co-evaporating an electron transport material, an organic metal complex and an active metal compound on the organic light-emitting layer to form an electron transport layer, wherein the active metal compound is an alkali metal compound, an alkali metal earth compound or a lanthanide metal compound; and evaporating a cathode on the electron transport layer.

Further, the organic metal complex is a quinoline metal complex.

Further, the quinoline metal complex is $Alq_3$ or $Gaq_3$.

Further, the alkali metal compound is an alkali metal nitride or an alkali metal borohydride; the alkali earth metal compound is an alkaline earth metal nitride or an alkali earth metal borohydride; and the lanthanide metal compound is a lanthanide metal nitride or a lanthanide metal borohydride.

Further, the alkali metal nitride includes $Li_3N$, $Na_3N$, $K_3N$ or $Rb_3N$; the alkali earth metal nitride includes $Mg_3N_2$, $Ca_3N_2$, $Sr_3N_2$ or $Ba_3N_2$; the lanthanide metal nitride includes LaN; and the alkali metal borohydride includes $LiBH_4$, $NaBH_4$ or $KBH_4$.

Further, the molar ratio of the electron transport material, the organic metal complex and the active metal compound in the electron transport layer is 1:(0.01-5):(0.01-5).

Further, the molar ratio of the electron transport material, the organic metal complex and the active metal compound in the electron transport layer is 1:1:1.

Beneficial Effects of the Present Invention

According to the present invention, by doping an organic metal complex and an active metal compound in an electron transport layer, in a high-temperature and vacuum environment, an active metal compound may be decomposed to form an active metal, and the active metal may effectively reduce an electron transport material compound and an organic metal complex to form a doped layer of the active metal. Therefore, a cathode structure with a lower driving voltage and a higher efficiency is obtained, and a wider range of materials can be used as the cathode.

BRIEF DESCRIPTION OF THE DRAWING

FIG. 1 is a schematic structure diagram of an organic electroluminescent device of the present invention.

DETAILED DESCRIPTION

In order to make those skilled in the art better understand and practice the present invention, the present invention is further described by specific embodiments. However, the embodiments exemplified herein are not intended to limit the present invention.

As shown in FIG. 1, an organic electroluminescent device of the present invention comprises a transparent substrate 1, a transparent anode 2, a hole transport layer 3, an organic light-emitting layer 4, an electron transport layer 5 and a cathode 6. In addition, the organic electroluminescent device further includes a hole injection layer, an electron injection layer and the like, and the structure thereof is the same as the existing organic electroluminescent device. The present invention is to form an electron transport and mixing layer by doping an organic metal complex and an active metal compound in an electron transport layer. The organic metal complex is preferably a quinoline metal complex with good thermal stability, for example, $Alq_3$ or $Gaq_3$. The active metal compound is an alkali metal compound, an alkali earth metal compound or a lanthanide metal compound. The alkali metal compound can be an alkali metal nitride, for example, $Li_3N$, $Na_3N$, $K_3N$ or $Rb_3N$, or may be an alkali metal borohydride, for example, $LiBH_4$, $NaBH_4$ or $KBH_4$; the alkali metal compound may be an alkali earth metal nitride, for example, $Mg_3N_2$, $Ca_3N_2$, $Sr_3N_2$ or $Ba_3N_2$, or may be an alkali earth metal borohydride; and the lanthanide metal compound may be a lanthanide metal nitride, for example, LaN, or may be a lanthanide metal borohydride.

The molar ratio of electron transport material, the organic metal complex and the active metal compound in the electron transport layer is 1:(0.01-5):(0.01-5), preferably 1:1:1. With regard to the electron transport material, common material in the prior art, for example, Bphen, TPBi, $Bebq_2$ or $Bepp_2$ and the like, and another type of electron transport material of high electron mobility may be adopted, for example, the material disclosed in Chinese Invention Patent No. CN101875637B:

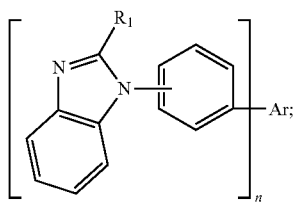

or the material disclosed in Chinese Invention Patent No. CN101891673B:

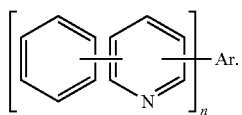

A method for preparing the organic electroluminescent device according to the present invention includes the following steps:

etching an anode pattern, evaporating an hole transport layer and an organic light-emitting layer in order on an indium tin oxide (ITO) glass substrate;

co-evaporating an electron transport material, an organic metal complex and an active metal compound on the organic light-emitting layer to form an electron transport layer, wherein the active metal compound is an alkali metal compound, an alkali metal earth compound or a lanthanide metal compound; and evaporating a cathode on the electron transport layer.

According to the present invention, an organic metal complex and an active metal compound are doped in an electron transport layer. The electron transport material has high mobility, and the organic metal complex has good thermal stability, and the electron transport layer has both mobility and stability. The active metal compound may release an active metal when being heated in vacuum, and the active metal may effectively reduce an electron transport material compound and an organic metal complex to form an N-doped structure, which facilitates the injection and transport of electrons. Therefore, a cathode structure having a lower driving voltage and a higher efficiency is obtained. In addition, since the active metal compound releases an active metal in a high-temperature and vacuum environment according to the present invention, there is no restriction on the cathode material, and a wider range of materials can be used as a cathode.

Descriptions will be given with reference to specific embodiments hereinafter.

Example 1

ITO(150 nm)/NPB(50 nm)/$Alq_3$(50 nm)/$Bebq_2$(15 nm): $Alq_3$(100%):$Li_3N$(100%)/Al(150 nm)

The anode is made from ITO. The material of the hole transport layer is NPB, with a thickness of 50 nm. The material of the organic light-emitting layer is $Alq_3$, with a thickness of 50 nm. The material forming the electron transport layer is $Bebq_2$, doped with $Alq_3$ (an organic metal complex) and $Li_3N$ (an alkali metal nitride). The total thickness of the electron transport layer is 45 nm. Relative to $Bebq_2$, $Alq_3$ and $Li_3N$ are measured by a molar ratio respectively, that is, the molar ratio of $Bebq_2$, $Alq_3$ and $Li_3N$ is 1:1:1. The material of the cathode is Al, with a thickness of 150 nm.

The method for preparing the organic electroluminescent device according to the present invention is as follows:

1) etching a fixed anode pattern on an ITO substrate according to the design;

2) cleaning the ITO glass substrate on which a fixed pattern has been etched by detergent ultrasonic cleaning and deionized water ultrasonic cleaning, and putting the ITO glass substrate under an infrared light for drying;

3) putting the processed glass substrate in a vacuum chamber, and evacuating to $1 \times 10^{-5}$ Pa, and continuously evaporating a hole transport layer (NPB) on the aforementioned anode layer film, the film growth rate of this layer being 0.1 nm/s and the film thickness being 50 nm;

4) evaporating $Alq_3$ as a light-emitting layer on the hole transport layer, the evaporating rate being 0.1 nm/s and the total film thickness being 50 nm;

5) evaporating an electron transport layer on the light-emitting layer, and co-evaporating $Bebq_2$, $Alq_3$ and $Li_3N$ during the evaporation, the molar ratio of $Bebq_2$, $Alq_3$, and $Li_3N$ being 1:1:1, the evaporation rate being 0.1 nm/s, and the total film thickness being 45 nm; and 6) continuously evaporating an Al layer as a cathode layer of the device on the aforementioned electron transport layer, the evaporation rate of the Al layer being 1 nm/s and the thickness thereof being 150 nm.

Example 2

The following device is prepared according to the method for preparing an organic electroluminescent device in Embodiment 1:

ITO(150 nm)/NPB(50 nm)/Alq$_3$(50 nm)/Bebq$_2$(15 nm):Alq$_3$(100%):Li$_3$N(100%)/Al(150 nm)

The anode is made from ITO. The material of the hole transport layer is NPB, with a thickness of 50 nm. The material of the organic light-emitting layer is Alq$_3$, with a thickness of 50 nm. The material forming the electron transport layer is Bebq$_2$, doped with Alq$_3$ (an organic metal complex) and Li$_3$N (an alkali metal nitride). The thickness of the electron transport layer is 45 nm. Relative to Bebq$_2$, Alq$_3$ and Li$_3$N are measured by a molar ratio, respectively, that is, the molar ratio of Bphen, Alq$_3$ and Li$_3$N is 1:1:1. The material of the cathode is Al, with a thickness of 150 nm.

Example 3

ITO(150 nm)/NPB(50 nm)/Alq$_3$(50 nm)/Bebq$_2$(15 nm):Alq$_3$(100%):Li$_3$N(50%)/Al(150 nm)

The anode is made from ITO. The material of the hole transport layer is NPB, with a thickness of 50 nm. The material of the organic light-emitting layer is Alq$_3$, with a thickness of 50 nm. The material forming the electron transport layer is Bphen, doped with Alq$_3$ (an organic metal complex) and KBH$_4$ (an alkali metal borohydride). The thickness of the electron transport layer is 35 nm. Relative to Bebq$_2$, Alq$_3$ and Li$_3$N are measured by a molar ratio %, respectively, that is, the molar ratio of Bphen, Alq$_3$ and Li$_3$N is 1:1:0.5. The material of the cathode is Al, with a thickness of 150 nm.

Example 4

ITO(150 nm)/NPB(50 nm)/Alq$_3$(50 nm)/Bebq$_2$(15 nm):Alq$_3$(1%):Li$_3$N(500%)/Al(150 nm)

The anode is made from ITO. The material of the hole transport layer is NPB, with a thickness of 50 nm. The material of the organic light-emitting layer is Alq$_3$, with a thickness of 50 nm. The material forming the electron transport layer is Bebq$_2$, doped with Alq$_3$ (an organic metal complex) and Li$_3$N (an alkali metal nitride). The total thickness of the electron transport layer is 90 nm. Relative to Bebq$_2$, Alq$_3$ and Li$_3$N are measured by a molar ratio, respectively, that is, the molar ratio of Bebq$_2$, Alq$_3$ and Li$_3$N is 1:0.01:5. The material of cathode is Al, with a thickness of 150 nm.

Example 5

ITO(150 nm)/NPB(50 nm)/Alq$_3$(50 nm)/Bebq$_2$(15 nm):Alq$_3$(500%):Li$_3$N(1%)/Al(150 nm)

The anode is an ITO. The material of the hole transport layer is NPB, with a thickness of 50 nm. The material of the organic light-emitting layer is Alq$_3$, with a thickness of 50 nm. The material forming the electron transport layer is Bebq$_2$, doped with Alq$_3$ (an organic metal complex) and Li$_3$N (an alkali metal nitride). The total thickness of the electron transport layer is 90 nm. Relative to Bebq$_2$, Alq$_3$ and Li$_3$N are measured by a molar ratio, respectively, that is, the molar ratio of Bebq$_2$, Alq$_3$ and Li$_3$N is 1:5:0.01. The material of cathode is Al, with a thickness of 150 nm.

Example 6

ITO(150 nm)/NPB(50 nm)/Alq$_3$(50 nm)/Bebq$_2$(15 nm):Alq$_3$(1%):Li$_3$N(1%)/Al(150 nm)

The anode is made from ITO. The material of the hole transport layer is NPB, with a thickness of 50 nm. The material of the organic light-emitting layer is Alq$_3$, with a thickness of 50 nm. The material forming the electron transport layer is Bebq$_2$, doped with Alq$_3$ (an organic metal complex) and Li$_3$N (an alkali metal nitride). The total thickness of the electron transport layer is 15 nm. Relative to Bebq$_2$, Alq$_3$ and Li$_3$N are measured by a molar ratio, respectively, that is, the molar ratio of Bebq$_2$, Alq$_3$ and Li$_3$N is 1:0.01:0.01. The material of cathode is Al, with a thickness of 150 nm.

Example 7

ITO(150 nm)/NPB(50 nm)/Alq$_3$(50 nm)/Bebq$_2$(15 nm):Alq$_3$(500%):Li$_3$N(500%)/Al(150 nm)

The anode is made from ITO. The material of the hole transport layer is NPB, with a thickness of 50 nm. The material of the organic light-emitting layer is Alq$_3$, with a thickness of 50 nm. The material forming the electron transport layer is Bebq$_2$, doped with Alq$_3$ (an organic metal complex) and Li$_3$N (an alkali metal nitride). The total thickness of the electron transport layer is 165 nm. With regard to Bebq$_2$, Alq$_3$ and Li$_3$N are measured by a molar ratio, respectively, that is, the molar ratio of Bebq$_2$, Alq$_3$ and Li$_3$N is 1:5:5. The material of cathode is Al, with a thickness of 150 nm.

Comparative Example 1

The following device is prepared according to the method for preparing an organic electroluminescent device in Embodiment 1:

ITO(150 nm)/NPB(50 nm)/Alq$_3$(50 nm)/Bebq$_2$(15 nm):Alq$_3$(100%):Li$_3$N(100%)/Al(150 nm)

The anode is made from ITO. The material of the hole transport layer is NPB, with a thickness of 50 nm. The material of the organic light-emitting layer is Alq$_3$, with a thickness of 50 nm. The material forming the electron transport layer is Bphen, doped with Alq$_3$ (an organic metal complex). The thickness of the electron transport layer is 30 nm. Relative to Bebq$_2$, Alq$_3$ is measured by a molar ratio, respectively, that is, the molar ratio of Bphen and Alq$_3$ is 1:1. The material of cathode is Al, with a thickness of 150 nm.

Comparative Example 2

The following device is prepared according to the method for preparing an organic electroluminescent device in Embodiment 1:

ITO(150 nm)/NPB(50 nm)/Alq$_3$(50 nm)/Bebq$_2$(15 nm):Alq$_3$(100%):Li$_3$N(100%)/Al(150 nm)

The anode is made from ITO. The material of the hole transport layer is NPB, with a thickness of 50 nm. The material of the organic light-emitting layer is Alq$_3$, with a thickness of 50 nm. The material forming the electron transport layer is Bphen, doped with Li$_3$N (an alkali metal/an alkali earth metal/a lanthanide metal compound). The thickness of the electron transport layer is 30 nm. Relative to Bebq$_2$, Li$_3$N is measured by a molar ratio, respectively, that is, the molar ratio of Bphen and Alq$_3$ is 1:1. The material of cathode is Al, with a thickness of 150 nm.

Under luminance of 1000 cd/m$^2$, the performances of devices in the embodiments and devices in the comparative examples are as shown in the following table:

| Number | Structure of Electron Transport Layer | Voltage (normalized to Embodiment 1) | Current Efficiency (normalized to Embodiment 1) |
|---|---|---|---|
| Embodiment 1: | $Bebq_2$(15 nm):$Alq_3$(100%):$Li_3N$(100%) | 1 | 1 |
| Embodiment 2 | $Bebq_2$(15 nm):$Alq_3$(100%):$Li_3N$(100%) | 0.98 | 1.12 |
| Embodiment 3 | $Bebq_2$(15 nm):$Alq_3$(100%):$Li_3N$(50%) | 1.06 | 0.97 |
| Embodiment 4 | $Bebq_2$(15 nm):$Alq_3$(1%):$Li_3N$(500%) | 1.08 | 0.98 |
| Embodiment 5 | $Bebq_2$(15 nm):$Alq_3$(500%):$Li_3N$(1%) | 1.55 | 0.76 |
| Embodiment 6 | $Bebq_2$(15 nm):$Alq_3$(1%):$Li_3N$(1%) | 1.22 | 0.92 |
| Embodiment 7 | $Bebq_2$(15 nm):$Alq_3$(500%):$Li_3N$(500%) | 1.35 | 0.82 |
| Comparative Example 1 | Bphe(15 nm):$Alq_3$(100%) | 1.97 | 0.65 |
| Comparative Example 2 | Bphen(15 nm):$Li_3N$(100%) | 1.63 | 0.68 |

It can be seen from the above table that the devices prepared in Examples 1 to 7 have a lower driving voltage and a higher current efficiency than the devices prepared in Comparative Examples 1 and 2. It can be proved that a electron transport layer formed by co-evaporating electron transport material with high mobility, an organic metal complex, an alkali metal/an alkali earth metal/a lanthanide metal compound has better device performance than an electron transport only formed of electron transport material and an organic metal complex or an alkali metal/an alkali earth metal/a lanthanide metal compound.

The present invention utilizes the properties of an active metal compound which releases an active metal when heated, and it may be understood by those skilled in the art that, according to the aforementioned embodiments, other active metal compounds not exemplified herein can also be applied to the present invention.

The aforementioned embodiments are only preferred embodiments merely used for describing the present invention in detail, and the protection scope of the present invention is not limited thereto. For a person skilled in the art, various replacements or improvements may be made based on the present invention, and these replacements or improvements shall be regarded as falling into the protection scope of the present invention. The protection scope of the present invention is subject to the appended claims.

What is claimed is:

1. An organic electroluminescent device, comprising an anode, a hole transport layer, an organic light-emitting layer, an electron transport layer and a cathode, characterized in that an organic metal complex and an active metal compound are doped in the electron transport layer, the electron transport layer comprises electron transport material, the organic metal complex and the active metal compound, wherein the active metal compound is an alkali metal compound, an alkaline earth metal compound or a lanthanide metal compound,
    wherein the alkali metal compound is an alkali metal nitride or an alkali metal borohydride; and the alkali earth metal compound is an alkaline earth metal nitride or an alkali earth metal borohydride; and the lanthanide metal compound is a lanthanide metal nitride or a lanthanide metal borohydride.
2. The organic electroluminescent device according to claim 1, characterized in that the alkali metal nitride includes $Li_3N$, $Na_3N$, $K_3N$ or $Rb_3N$; the alkali earth metal nitride includes $Mg_3N_2$, $Ca_3N_2$, $Sr_3N_2$ or $Ba_3N_2$; the lanthanide metal nitride includes LaN; and the alkali earth metal borohydride includes $LiBH_4$, $NaBH_4$ or $KBH_4$.
3. The organic electroluminescent device according to claim 1, characterized in that the organic metal complex is a quinoline metal complex.
4. The organic electroluminescent device according to claim 1, characterized in that the molar ratio of electron transport material, the organic metal complex and the active metal compound in the electron transport layer is 1:(0.01-5):(0.01-5).
5. The organic electroluminescent device according to claim 3, characterized in that the quinoline metal complex is $Alq_3$ or $Gaq_3$.
6. The organic electroluminescent device according to claim 4, characterized in that the molar ratio of the electron transport material, the organic metal complex and the active metal compound in the electron transport layer is 1:1:1.
7. A method for preparing an organic electroluminescent device, including:
    etching an anode pattern, evaporating an hole transport layer and an organic light-emitting layer in order on an ITO glass substrate;
    co-evaporating an electron transport material, an organic metal complex and an active metal compound on the organic light-emitting layer to form an electron transport layer wherein the active metal compound is an alkali metal compound, an alkali metal earth compound or a lanthanide metal compound; and
    evaporating a cathode on the electron transport layer,
    wherein the alkali metal compound is an alkali metal nitride or an alkali metal borohydride;
    and the alkali earth metal compound is an alkaline earth metal nitride or an alkali earth metal borohydride; and the lanthanide metal compound is a lanthanide metal nitride or a lanthanide metal borohydride.
8. The method for preparing an organic electroluminescent device according to claim 7, characterized in that the alkali metal nitride includes $Li_3N$, $Na_3N$, $K_3N$ or $Rb_3N$; the alkali earth metal nitride includes $Mg_3N_2$, $Ca_3N_2$, $Sr_3N_2$ or $Ba_3N_2$; the lanthanide metal nitride includes LaN; and the alkali metal borohydride includes $LiBH_4$, $NaBH_4$ or $KBH_4$.
9. The method for preparing an organic electroluminescent device according to claim 7, characterized in that the organic metal complex is a quinoline metal complex.
10. The method for preparing an organic electroluminescent device according to claim 7, characterized in that the molar ratio of the electron transport material, the organic metal complex and the active metal compound in the electron transport layer is 1:(0.01-5):(0.01-5).
11. The method for preparing an organic electroluminescent device according to claim 9, characterized in that the quinoline metal complex is $Alq_3$ or $Gaq_3$.

12. The method for preparing an organic electroluminescent device according to claim 10, characterized in that the molar ratio of the electron transport material, the organic metal complex and the active metal compound in the electron transport layer is 1:1:1.

* * * * *